(12) United States Patent
Lian et al.

(10) Patent No.: US 8,154,873 B2
(45) Date of Patent: Apr. 10, 2012

(54) HEAT DISSIPATION DEVICE FOR MEMORY MODULE

(75) Inventors: Zhi-Sheng Lian, Shenzhen (CN); Gen-Ping Deng, Shenzhen (CN)

(73) Assignees: Fu Zhun Precision Industry (Shen Zhen) Co., Ltd., Shenzhen City, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 242 days.

(21) Appl. No.: 12/629,899

(22) Filed: Dec. 3, 2009

(65) Prior Publication Data

US 2011/0051353 A1 Mar. 3, 2011

(30) Foreign Application Priority Data

Aug. 25, 2009 (CN) .......................... 2009 1 0306031

(51) Int. Cl.
*H05K 7/20* (2006.01)
*H01L 23/36* (2006.01)

(52) U.S. Cl. ........ 361/715; 361/709; 361/710; 361/711; 361/720; 361/679.32; 257/707

(58) Field of Classification Search .................. 361/707, 361/709–711, 715, 719, 728, 737, 720, 679.32; 257/707

See application file for complete search history.

(56) References Cited

U.S. PATENT DOCUMENTS

| 2,590,881 | A | * | 4/1952 | Morgan | 24/565 |
|---|---|---|---|---|---|
| 4,175,306 | A | * | 11/1979 | Bigelow et al. | 24/507 |
| 4,606,962 | A | * | 8/1986 | Reylek et al. | 428/148 |
| 5,109,318 | A | * | 4/1992 | Funari et al. | 361/710 |
| 5,710,693 | A | * | 1/1998 | Tsukada et al. | 361/679.32 |
| 5,896,274 | A | * | 4/1999 | Ishida | 361/737 |
| 5,966,287 | A | * | 10/1999 | Lofland et al. | 361/704 |
| 6,119,765 | A | * | 9/2000 | Lee | 165/80.3 |
| 6,233,150 | B1 | * | 5/2001 | Lin et al. | 361/704 |
| 6,297,961 | B1 | * | 10/2001 | Koizumi et al. | 361/720 |
| 6,343,020 | B1 | * | 1/2002 | Lin et al. | 361/816 |
| 6,362,966 | B1 | * | 3/2002 | Ali et al. | 361/728 |
| 6,377,460 | B1 | * | 4/2002 | Pohl et al. | 361/704 |
| 6,381,140 | B1 | * | 4/2002 | Liao | 361/729 |
| 6,424,532 | B2 | * | 7/2002 | Kawamura | 361/708 |
| 6,535,387 | B2 | * | 3/2003 | Summers et al. | 361/704 |
| 6,775,139 | B2 | * | 8/2004 | Hsueh | 361/697 |
| 6,888,719 | B1 | * | 5/2005 | Janzen et al. | 361/679.31 |
| 7,023,700 | B2 | * | 4/2006 | Chiou et al. | 361/704 |
| 7,079,396 | B2 | * | 7/2006 | Gates et al. | 361/719 |
| 7,106,595 | B2 | * | 9/2006 | Foster et al. | 361/721 |
| 7,333,338 | B2 | * | 2/2008 | Lai et al. | 361/715 |
| 7,345,882 | B2 | * | 3/2008 | Lee et al. | 361/710 |
| 7,349,219 | B2 | * | 3/2008 | Lai et al. | 361/719 |
| 7,349,220 | B2 | * | 3/2008 | Lai et al. | 361/719 |

(Continued)

*Primary Examiner* — Anatoly Vortman
(74) *Attorney, Agent, or Firm* — Altis Law Group, Inc.

(57) ABSTRACT

A heat dissipation device removing heat from a memory module includes two conducting plate clipping the memory module and an elastic member. Each conducting plate includes a lower part and an upper part. The two lower parts of the two conducting plates abut against two opposite sides of the memory module, respectively. The two upper parts of the two conducting plates are pivotably connected together and located above the memory module. The elastic member is located between the two upper parts and urges the two lower parts towards the memory module. The upper part of each conducting plate is slantwise at an obtuse angle to the lower part to make the two upper parts of the two conducting plates splay upwardly.

17 Claims, 5 Drawing Sheets

U.S. PATENT DOCUMENTS

| | | | |
|---|---|---|---|
| 7,375,964 B2* | 5/2008 | Lai et al. | 361/704 |
| 7,443,023 B2* | 10/2008 | Wehrly et al. | 257/707 |
| 7,457,122 B2* | 11/2008 | Lai et al. | 361/704 |
| 7,755,897 B2* | 7/2010 | Chen et al. | 361/707 |
| 7,990,699 B2* | 8/2011 | Lian et al. | 361/679.47 |
| 8,018,723 B1* | 9/2011 | Yu et al. | 361/715 |
| 2002/0039282 A1* | 4/2002 | Han et al. | 361/719 |
| 2003/0026076 A1* | 2/2003 | Wei | 361/704 |
| 2004/0130873 A1* | 7/2004 | Hsueh | 361/697 |
| 2004/0250989 A1* | 12/2004 | Im et al. | 165/80.1 |
| 2005/0141199 A1* | 6/2005 | Chiou et al. | 361/704 |
| 2005/0201063 A1* | 9/2005 | Lee et al. | 361/715 |
| 2006/0050489 A1* | 3/2006 | Wehrly et al. | 361/749 |
| 2006/0056154 A1* | 3/2006 | Foster et al. | 361/700 |
| 2006/0090102 A1* | 4/2006 | Wehrly et al. | 714/42 |
| 2006/0203454 A1* | 9/2006 | Chang | 361/707 |
| 2006/0268523 A1* | 11/2006 | Lin | 361/710 |
| 2007/0195489 A1* | 8/2007 | Lai et al. | 361/600 |
| 2007/0223198 A1* | 9/2007 | Lai et al. | 361/720 |
| 2007/0263360 A1* | 11/2007 | Lai et al. | 361/719 |
| 2007/0274032 A1* | 11/2007 | Ni et al. | 361/684 |
| 2008/0013282 A1* | 1/2008 | Hoss et al. | 361/715 |
| 2008/0101036 A1* | 5/2008 | Chen | 361/720 |
| 2009/0129026 A1* | 5/2009 | Baek et al. | 361/710 |
| 2009/0168356 A1* | 7/2009 | Chen et al. | 361/709 |
| 2009/0268408 A1* | 10/2009 | Liu et al. | 361/710 |

* cited by examiner

HEAT DISSIPATION DEVICE FOR MEMORY MODULE

BACKGROUND

1. Technical Field

The present disclosure relates to a heat dissipation device, and more particularly to a heat dissipation device for removing heat from a memory module.

2. Description of Related Art

The electronic components and memory modules, which are operated at or below 66 MHz, do not generate a large amount of heat that requires a cooling device for dissipating the heat. However, as the industry progresses, memory modules such as SDRAM DIMM memory modules are required to be operated at 100 MHz and above. For these state-of-the-art memory modules, heat dissipating members will be required to remove heat generated by the memory modules and protect the memory modules from damage due to overheating.

What is needed, therefore, is a heat dissipation device with great heat dissipating capacity for removing heat from the memory module.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
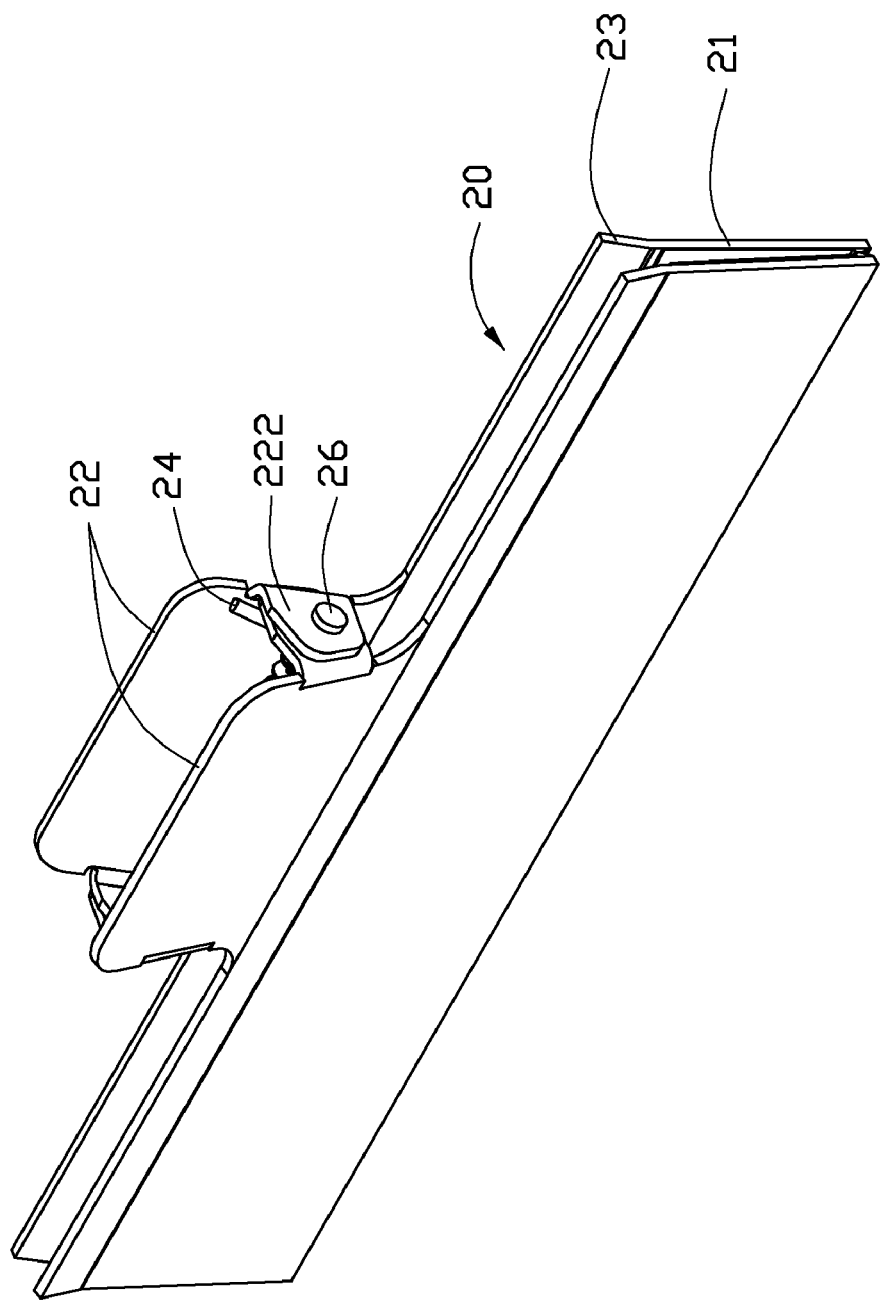
FIG. 1 is an isometric view of a heat dissipation device in accordance with an embodiment of the present disclosure.
Figure 2:
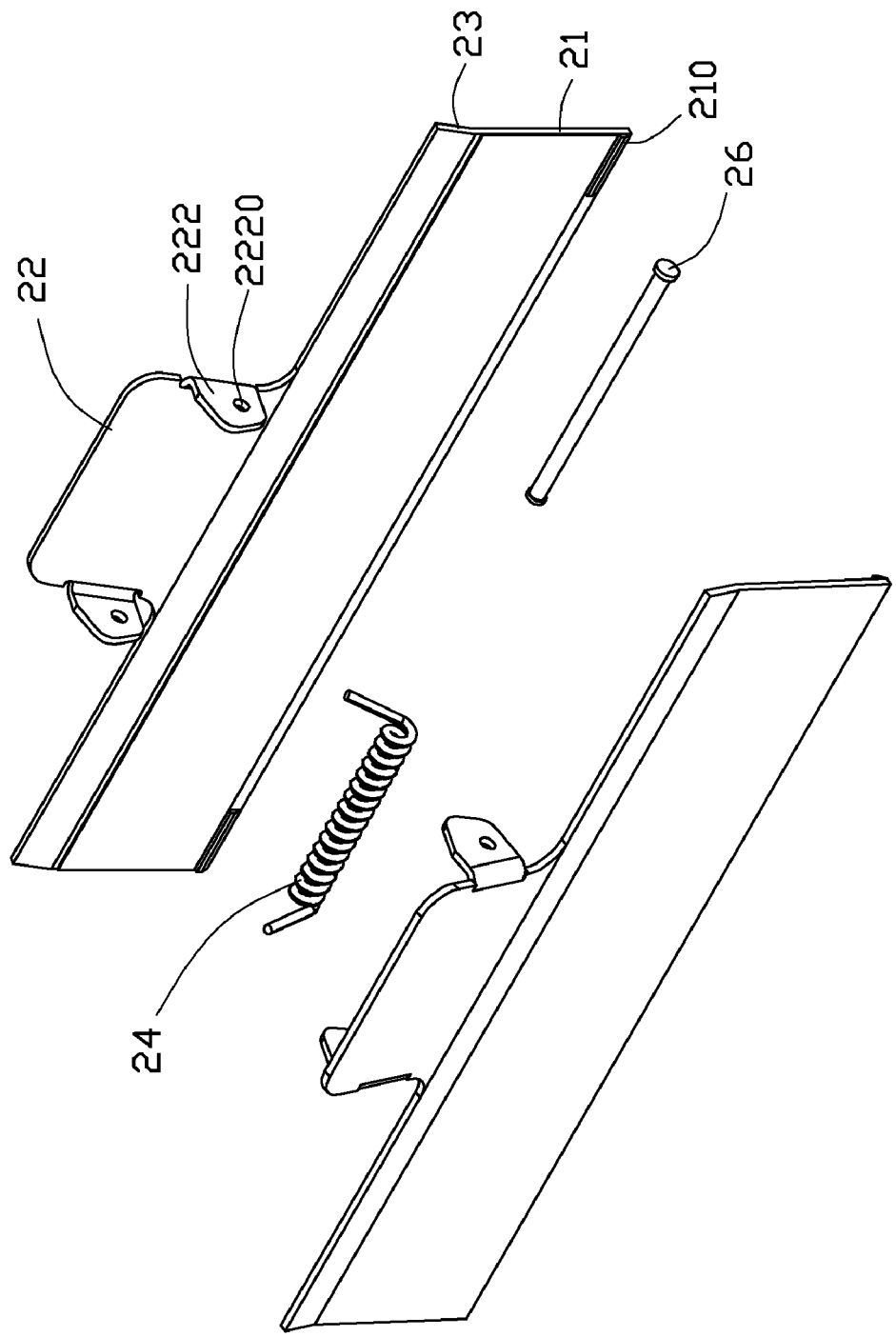
FIG. 2 is an exploded view of the heat dissipation device of FIG. 1.
Figure 3:
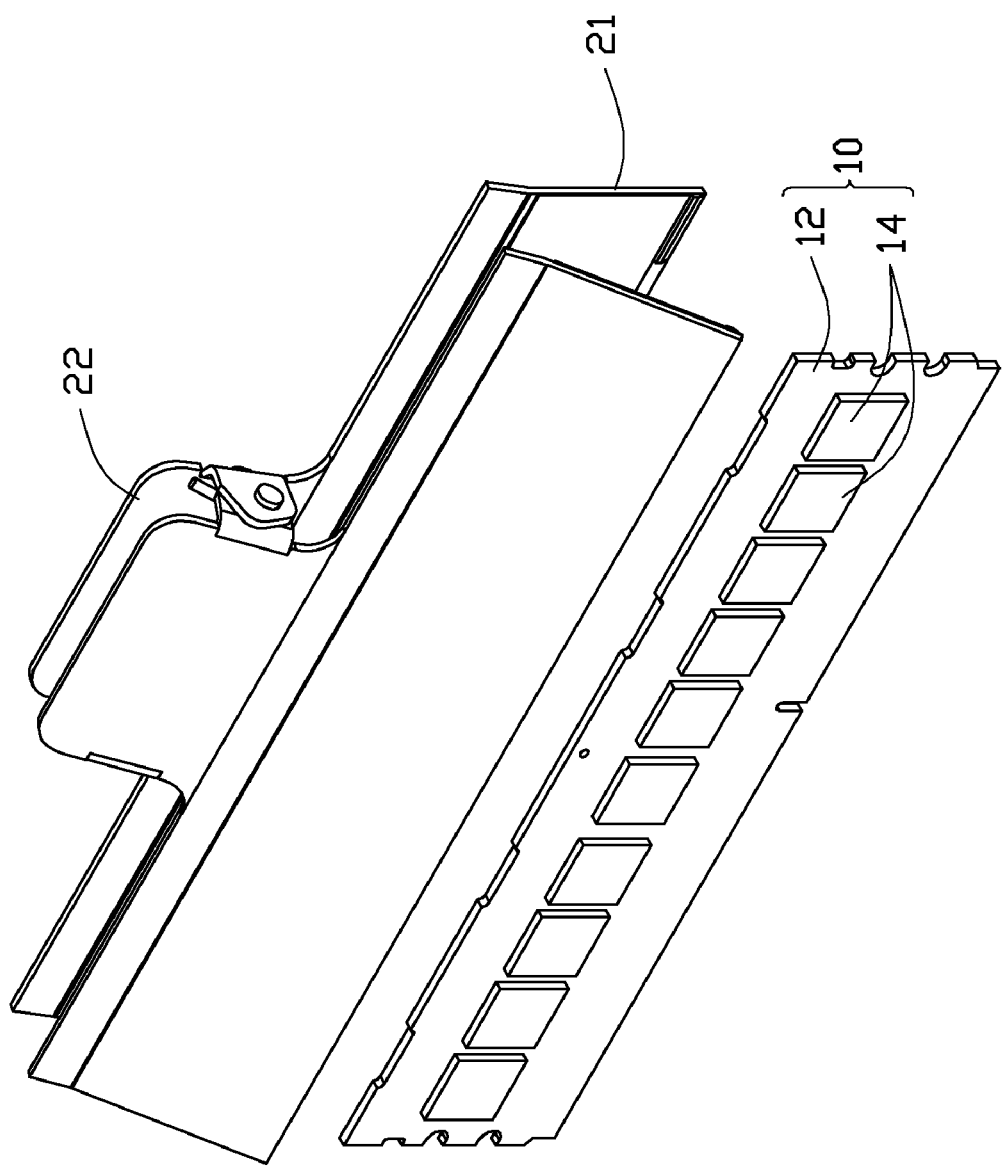
FIG. 3 is an isometric view showing the heat dissipation device in FIG. 1 to be mounted to a memory module.
Figure 4:
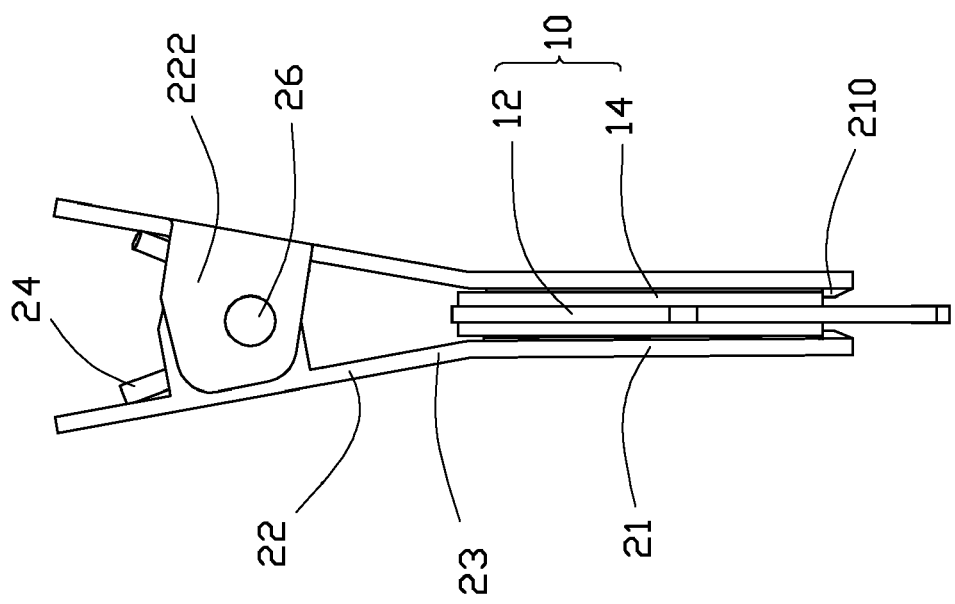
FIG. 4 is a side view of the heat dissipation device of FIG. 1, mounted to a memory module.

Referring to FIGS. 1-4, a heat dissipation device in accordance with a preferred embodiment of the present invention is devised for being mounted to a memory module 10 to remove heat therefrom. The memory module 10 comprises an elongated printed circuit board 12 and a plurality of chips 14 spaced from each other and mounted on two opposite sides of the printed circuit board 12. The chips 14 on each side of the printed circuit board 12 are arranged in a line along a lengthwise direction of the printed circuit board 12.

The heat dissipation device comprises a pair of conducting plates 20 sandwiching the chips 12 of the memory module 10 therebetween, a bolt 26 pivotally connecting upper parts of the two conducting plates 20 together and an elastic member 24 mounted around the bolt 26 and located between the upper parts of the heat conducting plates 20. The elastic member 24 is devised for providing an elastic force which urges lower rectangular conducting parts 21 of the two conducting plates 20 to move toward each other, thereby abutting against chips 14 on the two opposite sides of the printed circuit board 12.

Each conducting plate 20 is manufactured from thermal conductive material such as copper or aluminum. Each conducting plate 20 comprises the rectangular conducting part 21 for contacting the chips 14 of the memory module 10, a connecting part 23 bended outwardly and upwardly from a top edge of the conducting part 21 and an operating part 22 extending from a middle portion of a top edge of the connecting part 23.

The conducting parts 21 have areas large enough to cover and contact all of the chips 14 of the memory module 10. Each conducting part 21 has a width similar to that of the printed circuit board 12. A restricting protrusion 210 is extended inwardly from a lower edge of each conducting part 21. The restricting protrusion 210 is strip-shaped and extends along the lower edge of the conducting part 21, for abutting against lower edges of the chips 14 of the memory module 10 to prevent the heat dissipation device from slipping upwardly from the memory module 10. The connecting part 23 of each conducting plate 20 is coplanar with the operating part 22, but slantwise at an obtuse angle to the conducting part 21. The operating members 22 of the conducting plates 20 splay upwardly, for facilitating an operation of installing/uninstalling the heat dissipation device to/from the memory module 10. Each operating part 22 has a pair of spaced tabs 222 extending perpendicularly and inwardly from two opposite lateral sides thereof. Each tab 222 defines a through aperture 2220 in a centre thereof, wherein the two tabs 222 of one conducting plate 20 snugly engage two tabs 222 of another conducting plate 20 respectively.

The elastic member 24 preferably is a torsion spring 24 in this embodiment of the disclosure. The torsion spring 24 has a spring coil (not labeled) which is mounted around the bolt 26 and located between the tabs 222 of the conducting plates 20. The torsion spring 24 further has two arms (not labeled) extending upwardly from two ends of the spring coil and abutting against inner sides of upper portions of the operating parts 22 which are positioned above the bolt 26. The two arms force the upper portions of the operating parts 22 to move away from each other, whereby the two conducting parts 21 are urged to move toward each other. The bolt 26 is received in the through apertures 2220 of the tabs 222 and the spring coil of the spring 26 to thus pivotably connecting the two operating parts 22 of the conducting plates 20 together.

To mount the heat dissipation device to the memory module 10, the upper portions of the operating parts 22 of the conducting plates 20 are pressed toward each other to make the conducting parts 21 of the conducting plates 20 move away from each other. The two separated conducting parts 21 of the conducting plates 20 are then moved to the two opposite sides of the memory module 10. Finally, by releasing the pressing force on the operating parts 22 of the conducting plates 20, the two conducting parts 21 of the conducting plates 20 move toward each other to securely clip the memory module 10 therebetween and contact the chips 14 of the memory module 10 intimately by the elastic force of the torsion spring 24. Therefore, it is easy and simple to mount the heat dissipation device to the memory module 10. Furthermore, the heat dissipation device can be directly removed from the memory module 10 by compressing the upper portions of the operating parts 22 of the conducting plates 20 toward each other again to disengage the conducting parts 21 from the memory module 10.

In use of the heat dissipation device, heat generated by the chips 14 of the memory module 10 is absorbed by the conducting parts 21 of the conducting plates 10 to dissipate into ambient environment. The restricting protrusions 210 of the conducting plates 20 abut against the lower edges of the chips 14 of the memory module 10 to prevent the heat dissipation device from an upward slippage. Although it is not shown in the drawings, it can be easily understood by persons skilled in the art that thermal interface medium (TIM) such as thermal tapes or thermal grease is spread over inner surface of the conducting parts 21 of the conducting plates 20 and sandwiched between the chips 14 of the memory module 10 and the conducting parts 21 to enhance a thermal connection between the chips 14 and the conducting plates 20. Furthermore, the thermal tapes/thermal grease applied to the two conducting plates 20 are separated from each other by the restricting protrusions 210 before the heat dissipation device is mounted to the memory module 10.

Figure 5:
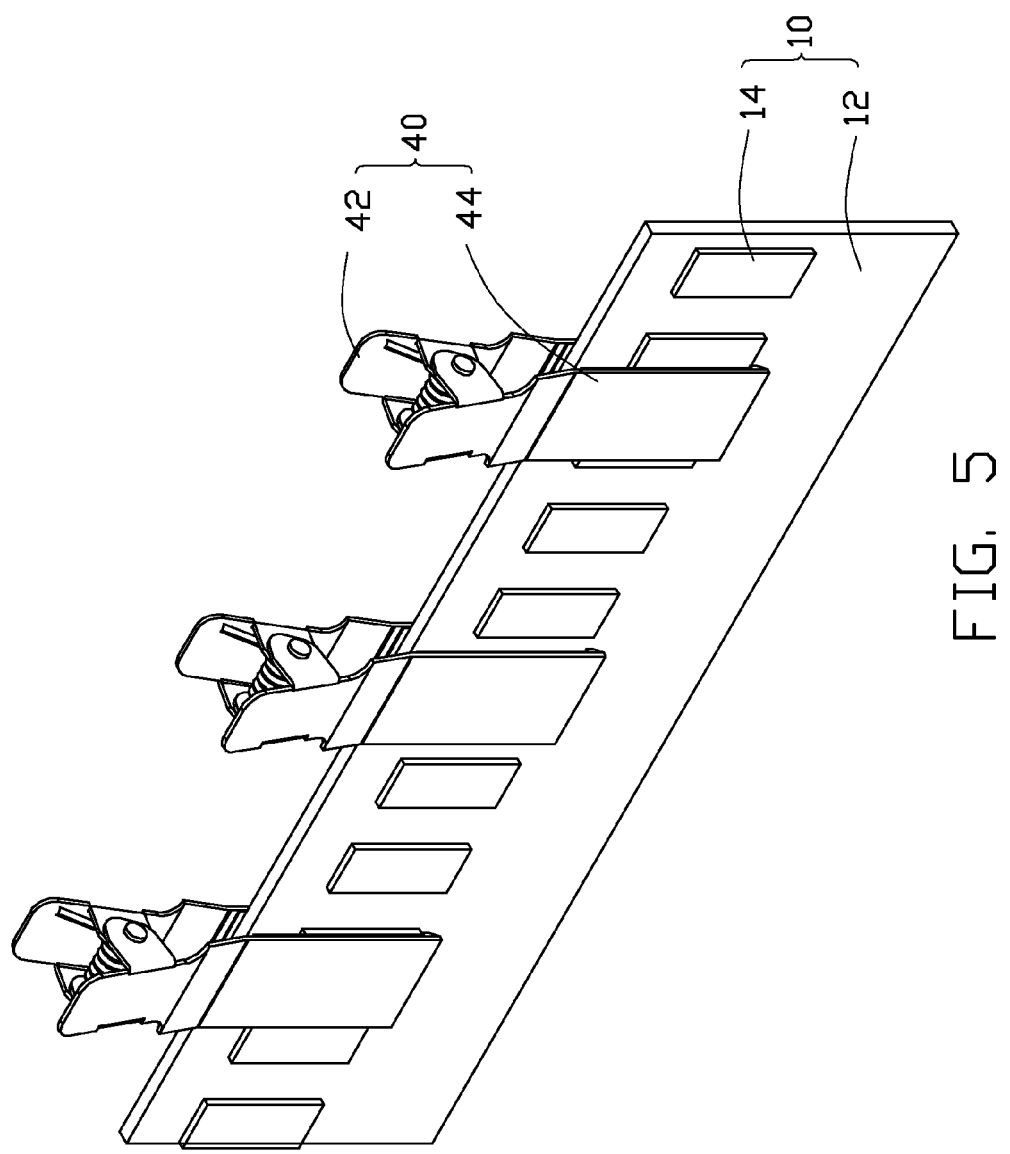
FIG. 5 is an isometric view of a heat dissipation device in accordance with another embodiment of the present disclosure, mounted on the memory module.

Referring to FIG. 5, a heat dissipation device for cooling the memory module 10 in accordance with an alternative embodiment of the present invention is shown. The difference between the two embodiments is that the heat dissipation device in accordance with the alternative embodiment includes a plurality of heat dissipating units 40. Each heat dissipating unit 40 has a configuration similar to the heat dissipation device in accordance with the first embodiment, except that a width of the conducting part 44 of each heat dissipating unit 40 is similar to that of the operating part 42 thereof. Each heat dissipating unit 40 clips the memory module 10 therebetween and only covers and contacts one or two of the chips 14 of the memory module 10.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation device removing heat from a memory module comprising:
   two conducting plates each comprising a lower part and an upper part, the two lower parts of the two conducting plates abutting against two opposite sides of the memory module, respectively, the two upper parts of the two conducting plates being pivotably connected together and located above the memory module; and
   an elastic member located between the two upper parts and urging the two lower parts towards the memory module;
   wherein the upper part of each conducting plate is slantwise at an obtuse angle to the lower part to make the two upper parts of the two conducting plates splay upwardly;
   wherein the two upper parts of the conducting plates are pivotably connected together by a bolt, the elastic member being mounted around the bolt;
   wherein each conducting plate comprises a conducting part, a connecting part bended outwardly and upwardly from a top edge of the conducting part and an operating part extending upwardly from a top edge part, the two conducting parts of the two conducting plates clipping the memory module therebetween and contacting chips mounted on at least one side of the memory module.

2. The heat dissipation device of claim 1, wherein the operating part is extended upwardly from a middle portion of the top edge of the connecting part.

3. The heat dissipation device of claim 1, wherein the connecting part of each conducting plate is coplanar with the operating part, but slantwise at an obtuse angle to the conducting part.

4. The heat dissipation device of claim 3, wherein a pair of spaced tabs extend perpendicularly and inwardly from two opposite lateral sides of the operating part of each conducting plate, each tab defining a through aperture in a centre thereof, the two tabs of one conducting plate snugly engaging the two tabs of another conducting plate, respectively.

5. The heat dissipation device of claim 4, wherein the elastic member is a torsion spring and has a spring coil mounted around the bolt and located between the tabs of the conducting plates, and two arms extending upwardly from two ends of the spring coil and abutting against inner sides of upper portions of the operating parts which are positioned above the bolt.

6. The heat dissipation device of claim 5, wherein the bolt is received in the through apertures of the tabs and the spring coil of the spring to thus pivotably connecting the two operating parts of the conducting plates together.

7. The heat dissipation device of claim 1, wherein each conducting plate has a restricting protrusion extending inwardly from a lower edge thereof and abutting against lower edges of chips of the memory module.

8. The heat dissipation device of claim 7, wherein the restricting protrusion is strip-shaped and extends along the lower edge of the each conducting plate.

9. A heat dissipation device removing heat from a memory module comprising:
   two conducting plates each comprising a conducting part, a connecting part bended outwardly and upwardly from a top edge of the conducting part and an operating part extending upwardly from a top edge of the connecting part, the two conducting parts of the two conducting plates clipping the memory module therebetween and contacting chips mounted on at least one side of the memory module, the two operating parts of the two conducting plates being pivotably connected together by a bolt and located above the memory module; and
   a torsion spring having a spring coil located between the two operating parts of the conducting plates, and two arms extending upwardly from two ends of the spring coil and abutting against inner sides of upper portions of the operating parts which are positioned above the bolt;
   wherein the connecting part of each conducting plate is coplanar with the operating part, but slantwise at an obtuse angle to the conducting part to make the two operating parts of the two conducting plates splay upwardly.

10. The heat dissipation device of claim 9, wherein the two operating parts of the conducting plates are pivotably connected together by a bolt, the spring coil of the torsion spring being mounted around the bolt.

11. The heat dissipation device of claim 10, wherein a pair of spaced tabs extend perpendicularly and inwardly from two opposite lateral sides of the operating part of each conducting plate, each tab defining a through aperture in a centre thereof, the two tabs of one conducting plate snugly engaging the two tabs of another conducting plate, respectively.

12. The heat dissipation device of claim 11, wherein the spring coil mounted around the bolt is located between the tabs of the conducting plates.

13. The heat dissipation device of claim 12, wherein the bolt is received in the through apertures of the tabs and the spring coil of the spring to thus pivotably connect the two operating parts of the conducting plates together.

14. The heat dissipation device of claim 9, wherein each conducting plate has a restricting protrusion extending inwardly from a lower edge thereof and abutting against lower edges of the chips of the memory module.

15. The heat dissipation device of claim 14, wherein the restricting protrusion is strip-shaped and extends along the lower edge of the conducting plate.

16. The heat dissipation device of claim 9, wherein the conducting part has a width larger than that of the operating part and similar to that of the memory module.

17. The heat dissipation device of claim 9, wherein the conducting part has a width similar to that of the operating part.

* * * * *